United States Patent

Taura et al.

Patent Number: 6,067,332
Date of Patent: May 23, 2000

[54] FREQUENCY SEARCHING METHOD AND DIGITAL AUDIO BROADCAST RECEIVER

[75] Inventors: Kenichi Taura; Masahiro Tsujishita; Tadatoshi Ohkubo; Masayuki Ishida; Masakazu Morita, all of Tokyo, Japan

[73] Assignee: Mitsubishi Denki Kabushiki Kaisha, Tokyo, Japan

[21] Appl. No.: 09/073,353

[22] Filed: May 6, 1998

[30] Foreign Application Priority Data

May 13, 1997 [JP] Japan ................................. 9-122191

[51] Int. Cl.[7] .................................................. H04L 27/06
[52] U.S. Cl. .......................... 375/344; 375/350; 375/354; 455/192.2
[58] Field of Search ...................... 375/344, 350, 375/316, 354, 362, 364, 365; 455/266, 340, 142, 553, 192.1, 192.2, 182.1, 182.2

[56] References Cited

U.S. PATENT DOCUMENTS

| | | |
|---|---|---|
| 5,191,576 | 3/1993 | Pommier et al. . |
| 5,228,025 | 7/1993 | Le Floch et al. . |
| 5,418,815 | 5/1995 | Ishikawa et al. .................... 375/216 |
| 5,457,716 | 10/1995 | Ang et al. .............................. 375/344 |
| 5,563,537 | 10/1996 | Seta . |
| 5,574,995 | 11/1996 | Masaki . |
| 5,692,016 | 11/1997 | Vanselow ............................... 375/344 |

FOREIGN PATENT DOCUMENTS

| | | |
|---|---|---|
| 0469301A2 | 2/1992 | European Pat. Off. . |
| 0559344A2 | 9/1993 | European Pat. Off. . |
| 2313527 | 11/1997 | United Kingdom . |

OTHER PUBLICATIONS

Kenichi Taura et al, "A Digital Audio Broadcasting (DAB) Receiver", IEEE Trans. on Consumer Electronics, vol. 42, No. 3, Aug. 1996, pp. 322–327.

*Primary Examiner*—Don N. Vo
*Assistant Examiner*—Phuong Phu

[57] ABSTRACT

A digital audio broadcast receiver searches for a receivable digital audio broadcast signal by first searching for a signal, having at least a predetermined power level, in which frame synchronization symbols can be detected. This stage of the search is made by searching a known frequency grid, or by scanning in steps approximately equal to the bandwidth of the digital audio broadcast signal. After frame synchronization symbols have been detected, the receiver attempts to find the center frequency of the received signal, changing the receiving frequency in steps less than the bandwidth of the digital audio broadcast signal, if necessary. A prompt indication that a receivable digital audio broadcast signal has been found is given when frame synchronization symbols are detected, or when the center frequency is found.

17 Claims, 10 Drawing Sheets

FREQUENCY SEARCHING METHOD AND DIGITAL AUDIO BROADCAST RECEIVER

BACKGROUND OF THE INVENTION

The present invention relates to a digital audio broadcast receiver, more particularly to a method used by the receiver to find a receivable signal broadcast in compliance with Recommendation BS.774 of the Radiocommunication Sector of the International Telecommunications Union (ITU-R), entitled "Service requirements for digital sound broadcasting to vehicular, portable and fixed receivers using terrestrial transmitters in the VHF/UHF bands."

The service requirements stated in this Recommendation include sound quality comparable to that of a compact disc recording, improved performance under multipath reception conditions, and the capability to transmit not only audio programming but also program-related data and value-added services to an inexpensive, mass-producible receiver. These requirements have been met by the Eureka Digital Audio Broadcasting (DAB) system, embodied in European Telecommunications Standard ETS 300 401. The Eureka DAB system has been tested extensively in Europe and elsewhere, and has been recommended by the ITU-R for use internationally.

Digital audio broadcasting has many advantages over analog broadcasting, especially for mobile receivers, but conventional digital audio broadcast receivers have also had the disadvantage of sluggish tuning, as compared with analog receivers. When the user of a conventional digital audio broadcast receiver selects a known broadcast frequency and program, before reception can begin, the receiver must synchronize itself with the broadcast signal and accurately tune itself to the broadcast frequency. In the Eureka DAB system, this is done by detecting a pair of synchronization symbols that are broadcast at intervals of ninety-six milliseconds (in one transmission mode) or twenty-four milliseconds (in another transmission mode). Each of the synchronization symbols must be detected repeatedly before synchronization and fine tuning are accomplished, so the process takes a certain amount of time.

Even after synchronization and tuning have been acquired, reception cannot begin immediately. Since several programs may be multiplexed in the same broadcast signal, the receiver must first receive enough program-related data to find the selected program. Next, the receiver must begin de-interleaving and decoding the audio data. In the Eureka DAB system, the de-interleaving delay alone is at least four-tenths of a second. Altogether, a quite noticeable interval of time elapses from the pressing of the selection button until the desired program is actually heard.

This delay may be disconcerting to users who are accustomed to instant reception from analog receivers. Before the receiver is able to begin reproducing the broadcast the user has selected, the user may conclude that the selected broadcast is not on the air, and switch to another selection.

If a digital audio broadcast frequency has not been preset in the receiver, the receiver must scan through a frequency band in which digital audio broadcast signals might appear, testing frequencies one by one for the presence of a receivable broadcast signal, and undertaking the process described above each time a receivable signal is found. To the user, who cannot immediately tell when a broadcast signal has been found, but must wait for the fine-tuning and other steps to be completed, the scanning process may seem aggravatingly slow.

If the scanned frequency band contained only digital audio broadcast signals, this last problem could be partially solved by a received signal strength indicator that indicated when a carrier signal had been picked up. Digital audio broadcast frequencies, however, are often assigned in a band already populated by analog broadcast signals. If the receiver simply indicates the presence of a carrier signal, the user cannot immediately tell whether the signal is a receivable digital audio broadcast signal, or a non-receivable signal of some other type.

A receiver may have both analog and digital receiving circuits, and be capable of receiving both types of broadcasts. Even in this case, the receiver requires a way of speedily discriminating between analog and digital broadcast signals, so that appropriate action can be taken.

SUMMARY OF THE INVENTION

An object of the present invention is to shorten the search time for a receivable digital audio broadcast signal.

Another object of the invention is to provide the user with prompt notification when a receivable digital audio broadcast signal is found.

The invention provides a method of searching for a receivable digital audio broadcast signal having a bandwidth substantially equal to a certain bandwidth $f_1$, and a digital audio broadcast receiver employing this method. The digital audio broadcast signal is divided into frames, each frame having a frame synchronization symbol.

The search begins by changing the receiving frequency by amounts equal to or greater than $f_1$, until a frequency is found at which the level of the received signal is equal to or greater than a predetermined threshold, and frame synchronization symbols are detected in the received signal. This stage of the search can be carried out by searching a predetermined grid of digital audio broadcast frequencies, or by simply stepping the receiving frequency through a band in which digital audio broadcasters might be operating, in steps equal to $f_1$.

In an optional next stage of the search, the receiving frequency is altered in steps of less than half of $f_1$, to find a frequency at which the received signal reaches a peak level, and the receiving frequency is set to this frequency.

Finally, a search is made for the center frequency of the received signal, using data demodulated from the received signal. During this stage of the search, if necessary, the receiving frequency can be changed repeatedly by an amount less than $f_1$. When the center frequency is found within the data demodulated from the received signal, the receiving frequency is set to the center frequency, and reception begins.

The invented receiver may filter the received signal with a first filter having a passband narrower than $f_1$ during the search, then switch to a second filter with a wider passband during reception. The receiver may also have a receiving circuit for receiving signals other than the above-described digital audio broadcast signal, using the first filter.

The receiver preferably has an indicator that indicates when a digital audio broadcast signal has been found. The indicator can be activated when the frame synchronization symbol is detected, or when the center frequency is found.

DETAILED DESCRIPTION OF THE INVENTION

Embodiments of the invention will be described with reference to the attached exemplary drawings. Although the invention is not restricted to the Eureka DAB system, use of this system will be assumed in the described embodiments.

First Embodiment

Figure 1:
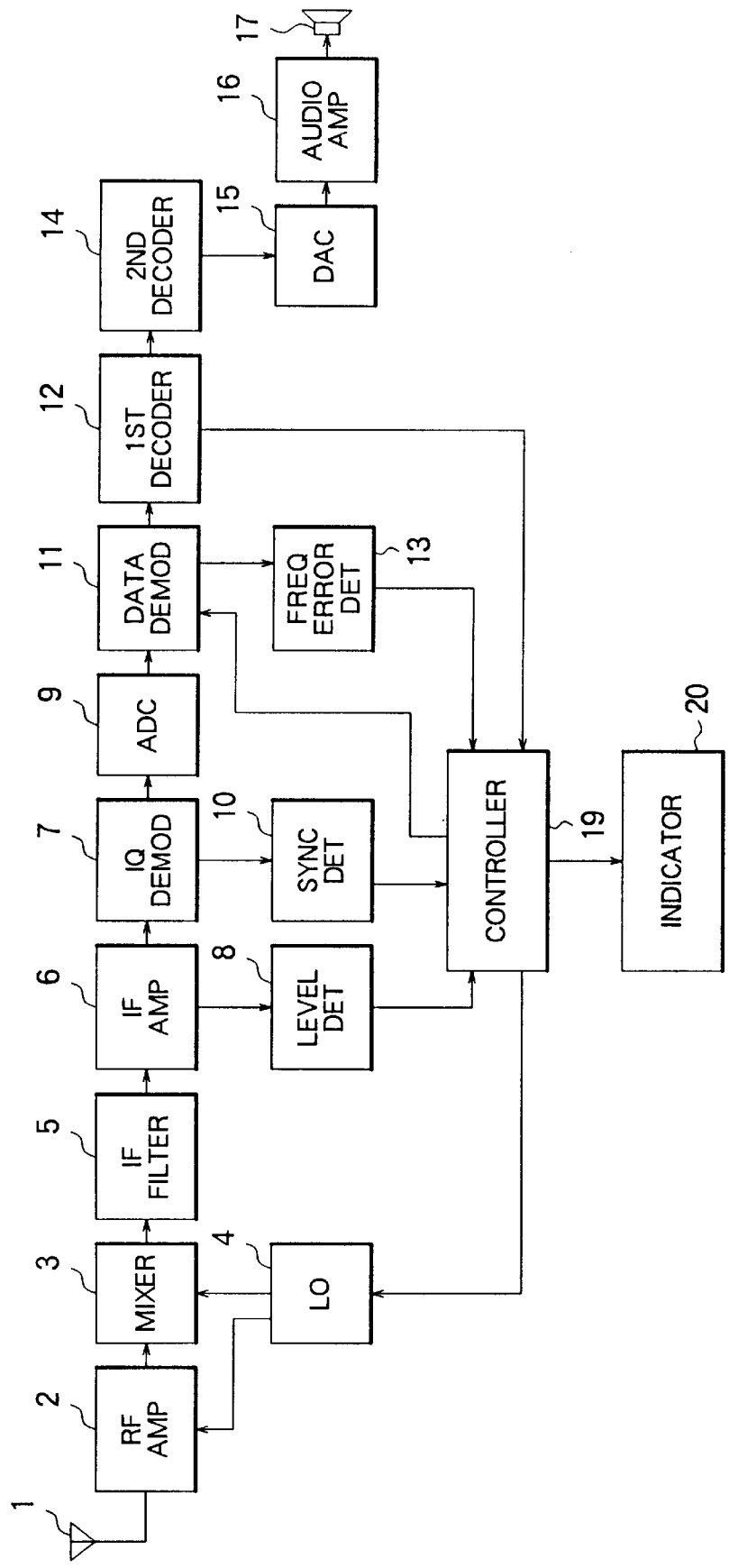
FIG. 1 is a block diagram of a digital audio broadcast receiver illustrating a first embodiment of the invention.

Referring to FIG. 1, the first embodiment is a digital audio broadcast receiver comprising an antenna 1, a radio-frequency amplifier (RF AMP) 2, a mixer 3, a local oscillator (LO) 4, an intermediate-frequency (IF) filter 5, an IF amplifier 6, an orthogonal demodulator (IQ DEMOD) 7, a level detector (DET) 8, an analog-to-digital converter (ADC) 9, a frame synchronization detector (SYNC DET) 10, a data demodulator 11, a first decoder 12, a frequency error detector (FREQ ERROR DET) 13, a second decoder 14, a digital-to-analog converter (DAC) 15, an audio amplifier 16, a loudspeaker 17, a controller 19, and an indicator 20.

Figure 2:
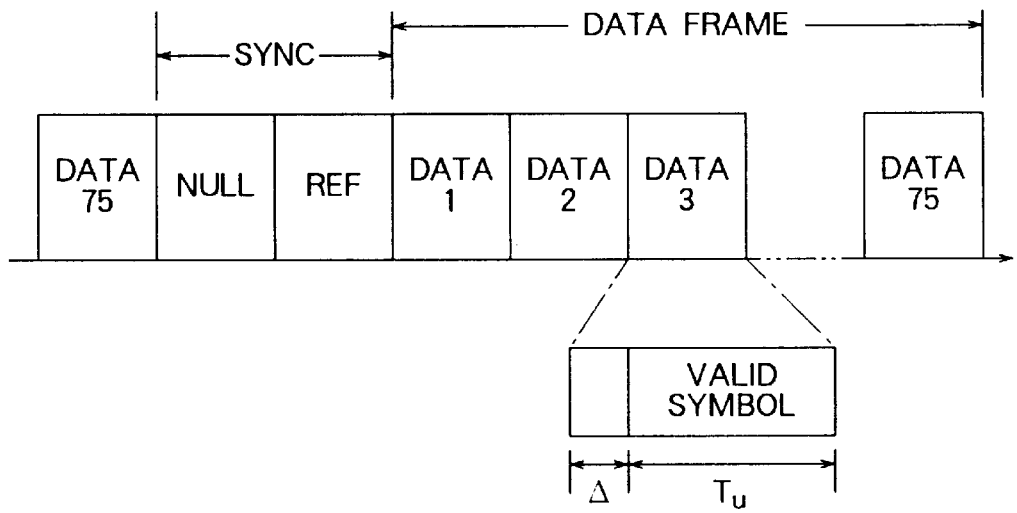
FIG. 2 illustrates the frame structure of the digital audio broadcast signal.

The digital audio broadcast signal received by this receiver is modulated by orthogonal frequency division multiplexing (OFDM) and differential quadrature phase-shift keying (QPSK). Referring to FIG. 2, the transmitted data are grouped into frames of seventy-five symbols each. The data symbols are preceded by a null symbol, which is a frame synchronization symbol, and a reference symbol, which provides information for phase synchronization and fine tuning. The amplitude of the transmitted signal is reduced to zero for the duration of the null symbol. For the rest of the frame, the transmitted signal occupies a bandwidth of substantially 1.5 megahertz, comprising subcarrier frequencies spaced at regular intervals on both sides of a center frequency. Each data symbol comprises a guard interval ($\Delta$) and a valid symbol interval ($T_u$). The data are convolutionally coded, and are interleaved on both the time and frequency axes.

In transmission mode I, there are one thousand five hundred thirty-six subcarriers, and the frame length is ninety-six milliseconds. In transmission mode II, there are three hundred eighty-four subcarriers, and the frame length is twenty-four milliseconds.

Referring again, to FIG. 1, the RF amplifier 2 amplifies the radio-frequency signal received by the antenna 1. The mixer 3 down-converts the amplified signal to an intermediate frequency, using an oscillator signal supplied by the local oscillator 4. The IF filter 5, which has a passband substantially equal in width to the bandwidth of the transmitted digital audio broadcast signal, removes adjacent-channel interference and other unwanted components. The IF amplifier 6 amplifies the filtered signal, and the orthogonal demodulator 7 separates the resulting amplified signal into a complex-valued signal with in-phase (I) and quadrature (Q) components. These components are sampled and converted to digital form by the analog-to-digital converter 9.

The data demodulator 11 demodulates the digitized I and Q components by performing a complex discrete Fourier transform (DFT), thereby resolving each received symbol into an array of complex values, comprising one complex value for each subcarrier frequency. The data demodulator 11 also compares consecutive values at each subcarrier frequency, thereby differentially demodulating the data, and outputs the differentially demodulated data to the first decoder 12 in a sequence that de-interleaves the data on the frequency axis. The first decoder 12 de-interleaves the data on the time axis, then performs a convolutional decoding process to correct transmission errors.

The data output by the first decoder 12 comprise both audio data, which are supplied to the second decoder 14, and control data indicating program content and the multiplex configuration of the transmitted data. The control data are supplied to the controller 19.

The audio data have been compressed according to Layer Two of the ISO/MPEG-1 standard, ISO and MPEG being acronyms for, respectively, the International Standards Organization and the Moving Picture Experts Group. The second decoder 14 is an MPEG audio decoder that decompresses the audio data. The digital-to-analog converter 15 converts the decompressed data to an analog signal, which is amplified by the audio amplifier 16 and reproduced through the loudspeaker 17.

The orthogonal demodulator 7 also sends the demodulated analog signal to the frame synchronization detector 10. The frame synchronization detector 10 is an envelope detector that detects the null symbol in each frame and notifies the controller 19. The controller 19 thereby infers the timing at which the reference symbol and each data symbol starts, and controls the data demodulator 11 so that the discrete Fourier transform is aligned with the symbol boundaries. The guard intervals allow a margin for timing errors.

The frequency error detector 13 receives demodulated data from the data demodulator 11, and determines the location of the center frequency of the broadcast signal, in relation to the frequency to which the digital audio broadcast receiver is tuned. To locate the center frequency approximately, the frequency error detector 13 uses the data demodulated from the reference symbol. The phase reference symbol is designed so that after differential demodulation in the frequency direction, the phase reference data can be correlated with a fixed pattern of sixteen or thirty-two complex values, the pattern with thirty-two values comprising two repetitions of the pattern with sixteen values. As this fixed pattern is shifted in the frequency direction in relation to the received data, peak correlations appear at intervals of thirty-two subcarriers, with smaller peaks offset at intervals of sixteen subcarriers.

The phase of the peak values rotates by substantially ninety degrees every thirty-two subcarrier frequencies, and the direction of rotation reverses at the center frequency. By finding the reversal of rotation, the frequency error detector 13 can locate the center frequency, at least to within the subcarrier frequency spacing. The center frequency can be found in this way if the received portion of the digital audio broadcast signal includes at least sixteen subcarriers above the center frequency and sixteen subcarriers below the center frequency, although thirty-two subcarriers above and below is preferable.

Even when the center frequency is not among the received frequencies and cannot be specifically located in this way, from the direction of rotation of the peak values, the frequency error detector 13 can determine whether the center frequency lies above or below the received frequencies. For this determination, it suffices to receive a portion of the digital audio broadcast signal comprising forty-eight subcarriers.

During the search for a receivable digital audio broadcast signal, accordingly, as soon as a modest portion of a digital audio broadcast signal is received, the frequency error detector 13 notifies the controller 19 of the approximate location of the center frequency, or at least indicates the direction in which to look for the center frequency. During reception, when the receiver has already been tuned close to the center frequency, the frequency error detector 13 determines the tuning error more precisely, using data demodulated from both the phase reference symbol and the data symbols, and the local oscillator 4, frequency error detector 13, and controller 19 operate as an automatic frequency control loop, keeping the receiver substantially locked on the center frequency.

Figure 3:
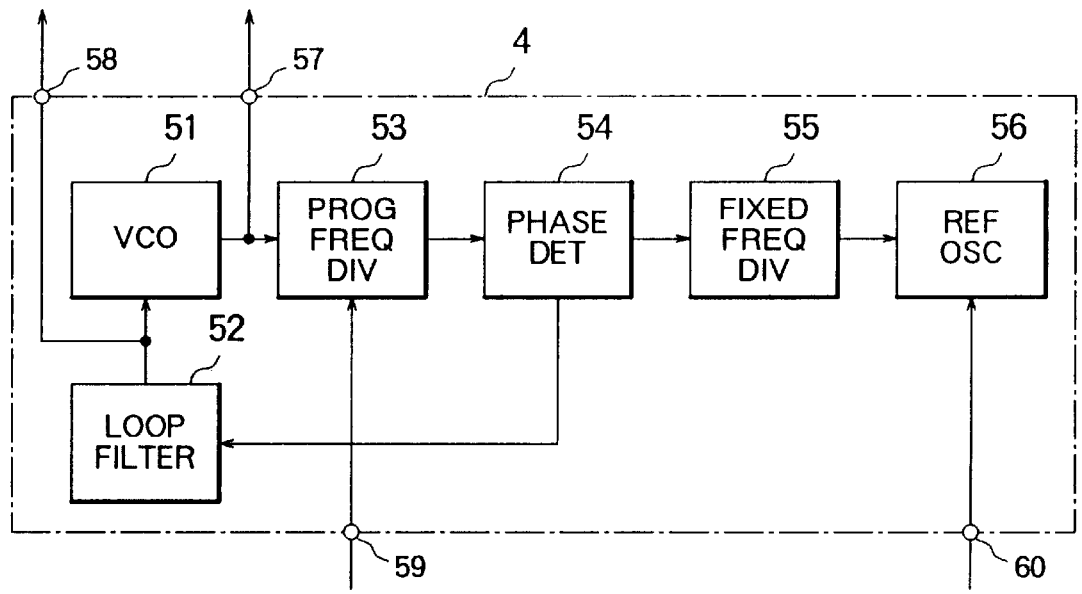
FIG. 3 is a more detailed block diagram of the local oscillator in FIG. 1.

FIG. 3 shows the internal structure of the local oscillator 4, which comprises a voltage-controlled oscillator or VCO 51, a loop filter 52, a programmable frequency divider (PROG FREQ DIV) 53, a phase detector (DET) 54, a fixed frequency divider 55, and a reference oscillator (REF OSC) 56. The signals output from the local oscillator 4 are an oscillator signal, which is output from the VCO 51 through an oscillator signal output terminal 57 to the mixer 3, and a control voltage, which is output from the loop filter 52 through a tuning voltage terminal output 58 to the RF amplifier 2. The signals input to the local oscillator 4 are a tuning data signal, which is input through a tuning data input terminal 59 to the programmable frequency divider 53, and a frequency control voltage, which is input through a frequency control voltage input terminal 60 to the reference oscillator 56.

The VCO, 51, loop filter 52, programmable frequency divider 53, and phase detector 54 constitute a phase-locked loop. The reference oscillator 56 is a voltage-controlled crystal oscillator, controlled by the frequency control voltage input at terminal 60, that supplies a reference signal through the fixed frequency divider 55 to the phase detector 54. The frequency of the reference signal, after division by the fixed frequency divider 55, will be denoted $f_{REF}$. The reference frequency $f_{REF}$ is substantially equal to the closest spacing between the center frequencies of different digital audio broadcast signals, or to an integer submultiple of this spacing. This spacing is naturally equal to or greater than the bandwidth of each of the digital audio broadcast signals.

The programmable frequency divider 53 divides the frequency $f_{LO}$ of the oscillator signal output from the VCO 51 by an integer N set according to the tuning data. The phase-locked loop operates to hold $f_{LO}$ equal to N times $f_{REF}$. If $N_1$ is the ratio obtained by dividing the reference frequency $f_{REF}$ into the intermediate frequency $f_{IF}$ at the center of the passband of the IF filter 5, then the receiving frequency $f_{RF}$ to which the digital audio broadcast receiver is tuned can be expressed as follows.

$$f_{RF} = f_{LO} - f_{IF} = f_{REF}(N - N_1)$$

The control voltage output from the control voltage output terminal 58 is used to set the RF amplifier 2 so that this frequency $f_{RF}$ is amplified.

Referring again to FIG. 1, the level detector 8 detects the power level of the intermediate-frequency signal output by the IF amplifier 6. The output of the level detector 8, which is sent to the controller 19, indicates the power received at the antenna 1 in a frequency range equal to the bandwidth of the IF filter 5, centered at the receiving frequency $f_{RF}$. Based on the information supplied by the level detector 8 and frequency error detector 13, the controller 19 supplies signals to the tuning data input terminal 59 and frequency control voltage input terminal 60 of the local oscillator 4, and controls the indicator 20. The indicator 20 is, for example, a light-emitting diode, or an electronic tone generator.

The first embodiment operates in an area having an established grid of digital audio broadcasting frequencies. Such a frequency grid has been proposed in Europe, to simplify the tuning of digital audio broadcast receivers. The center frequencies of digital audio broadcasts are restricted to frequencies in the frequency grid.

Figure 4:
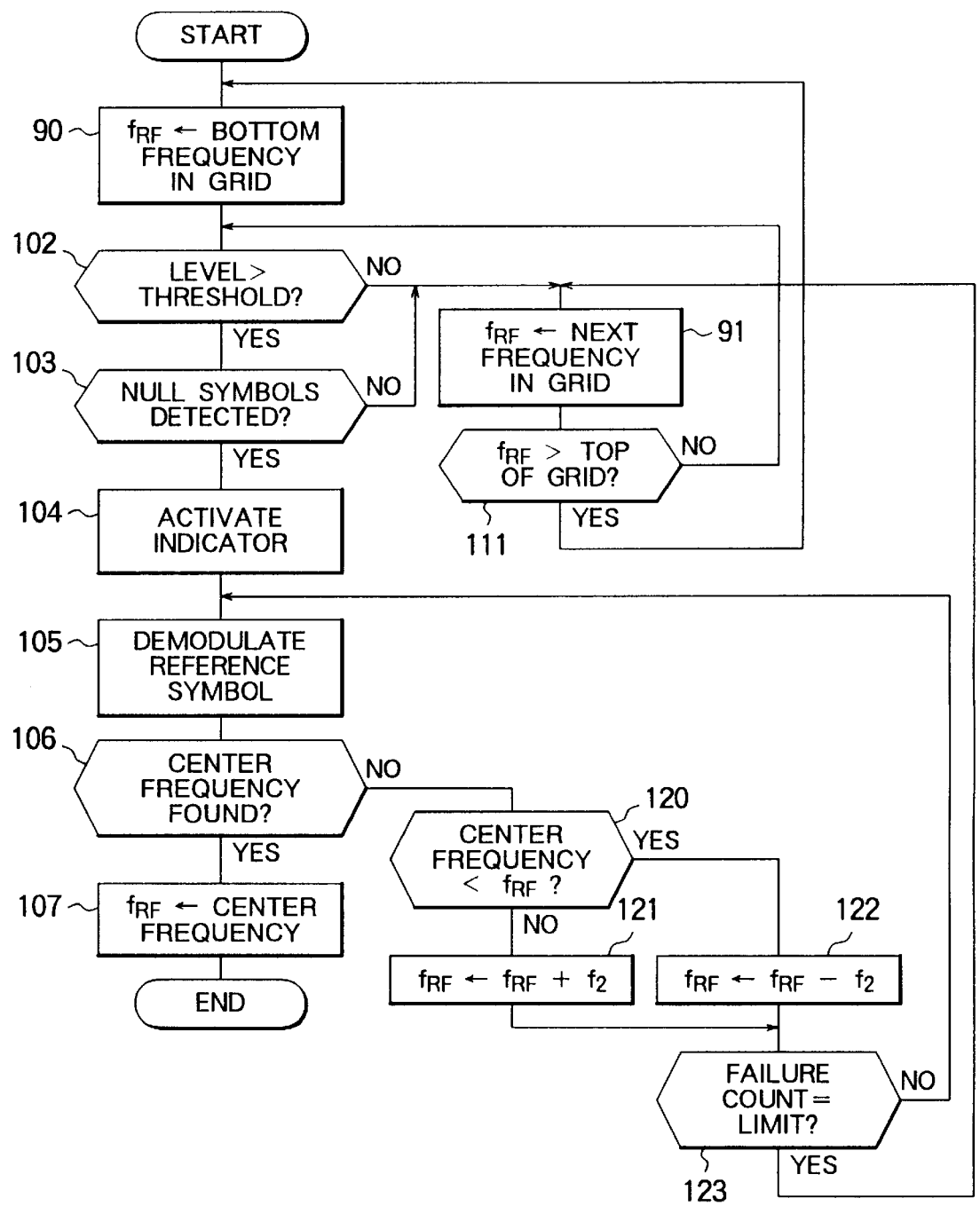
FIG. 4 is a flowchart illustrating the operation of the first embodiment.

In searching for a receivable digital audio broadcast signal in the frequency grid, the first embodiment operates as shown in FIG. 4. The procedure in FIG. 4 is carried out when, for example, the receiver is turned on, if the receiver has no pre-stored information indicating which frequencies in the frequency grid are used in the local area.

In the first step 90, the controller 19 sends the local oscillator 4 tuning data corresponding to the lowest frequency in the frequency grid. In the next step 102, the output of the level detector 8 is compared with a predetermined threshold. If the received level exceeds the threshold, then in the next step 103, the output of the frame synchronization detector 10 is checked to see if null symbols can be detected at intervals equal to the frame length.

If the received signal level is below the threshold in step 102, or if null symbols cannot be detected in step 103, then in steps 91 and 111, the receiving frequency is changed to the next higher frequency in the frequency grid, and a return is made to step 102. If the receiving frequency was already set at the top of the frequency grid, and increasing the receiving frequency takes it past the top of the grid, this condition is detected in step 111 and a return is made to step 90, to begin searching again from the lowest frequency.

When null symbols are detected at the expected intervals in step 103, then in step 104, the controller 19 controls the indicator 20 to notify the user that a digital audio broadcast signal has been found. The controller 19 also memorizes the frequency $f_0$ of this signal in the frequency grid, and clears a memory area in which a failure count is stored, setting the failure count to zero.

In the next step 105, the data demodulator 11 demodulates the reference symbol, using timing control information supplied by the controller 19. In step 106, the frequency error detector 13 attempts to locate the center frequency as described above.

If the center frequency is not part of the received portion of the broadcast signal, or is located too near one end of the received spectrum to be found from the demodulated reference data, then in step 120, the controller 19 increments the failure count, and the frequency error detector 13 determines whether the receiving frequency $f_{RF}$ is too high or too low.

If the receiving frequency is too low, then in step 121 the controller 19 changes the tuning data to increase the local oscillator frequency by an amount $f_2$ substantially equal to, or less than, half the bandwidth of the digital audio broadcast signal. If the receiving frequency is too high, then in step 122 the controller 19 decreases the local oscillator frequency by $f_2$.

After step 121 or 122, the controller 19 compares the failure count with a limit count in step 123. If the failure count has not reached the limit count, the controller 19 returns to step 105, to demodulate another reference symbol and attempt again to find the center frequency. If the failure count has reached the limit count, the controller 19 returns to step 91, to try the next frequency in the frequency grid.

When the frequency error detector 13 finds the center frequency in step 106, the controller 19 proceeds in step 107 to set the local oscillator 4 to the center frequency, and the search ends. Following the search procedure, the controller 19 carries out further fine tuning and automatic frequency control, the decoders 12 and 14 begin de-interleaving and decoding the received data, and reception of the digital audio broadcast begins.

By searching a known frequency grid, the first embodiment greatly reduces the search time, as compared with receivers that simply scan up or down the available frequency band. Furthermore, when null symbols are detected in step 103, this almost always indicates the presence of a receivable digital audio broadcast signal. By activating the indicator 20 in step 104, the first embodiment quickly reassures the user that reception is about to begin. Thus when the user turns the receiver on, instead of having to wait until a broadcast is actually heard, the user obtains an early indication that a signal is being received.

When the user selects a known digital audio broadcast frequency that has been preset in the receiver, the procedure in FIG. 4 is carried out with a frequency grid consisting of a single frequency. Step 104 promptly informs the user as to whether a digital audio broadcast signal has been found at the selected frequency, so that the user can quickly decide whether to wait for reception to begin, or to select another frequency.

Second Embodiment

The second embodiment has the same hardware configuration as the first embodiment, shown in FIG. 1, but operates in an area without a known digital audio broadcasting frequency grid. The frequency $f_{REF}$ generated by the reference oscillator 56 is now substantially equal to the bandwidth of the digital audio broadcast signal, or an integer submultiple thereof.

Figure 5:
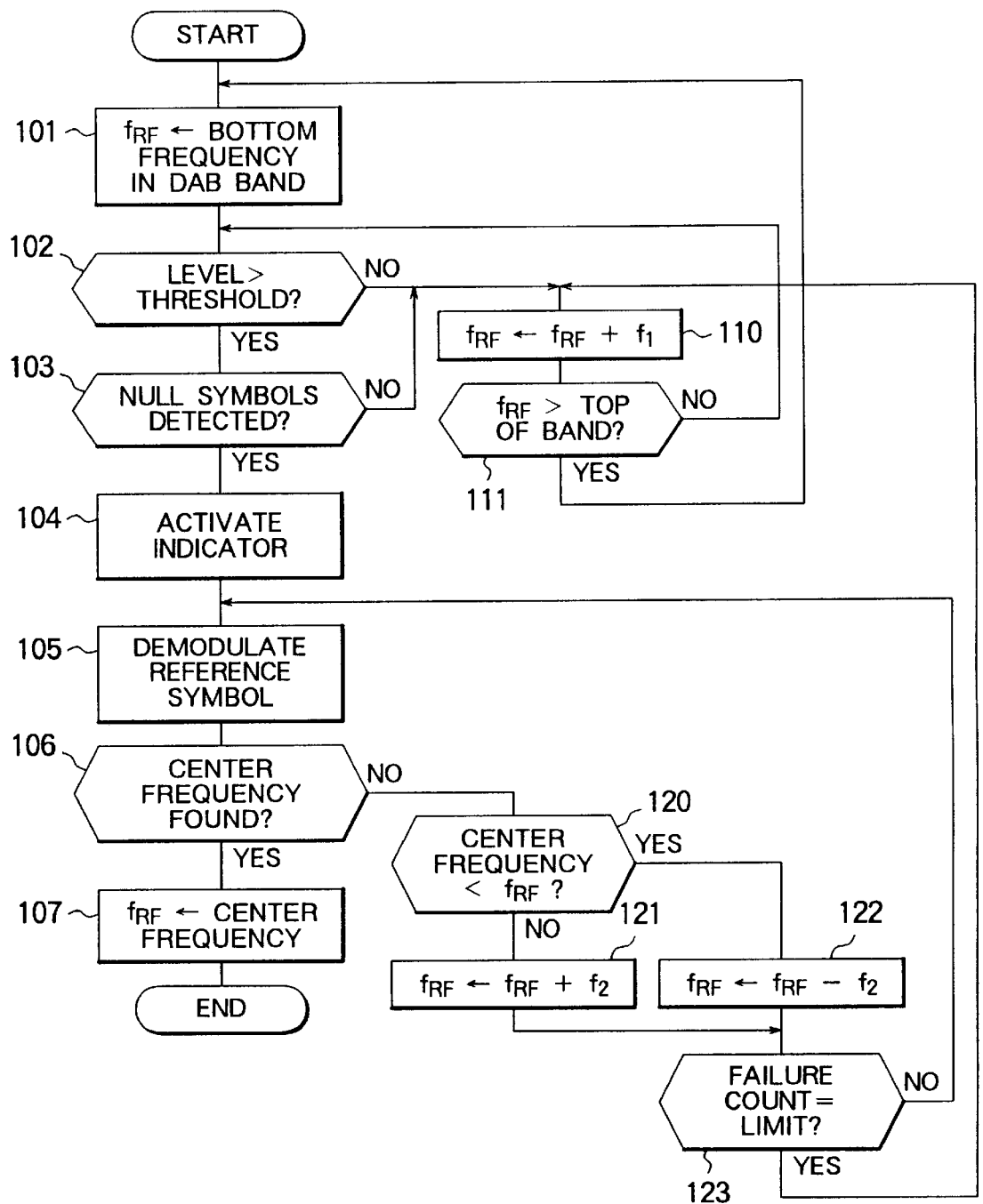
FIG. 5 is a flowchart illustrating the operation of a second embodiment.

FIG. 5 shows the procedure followed to search for a receivable digital audio broadcast signal in the second embodiment, using the same reference numerals as in FIG. 4 for steps that are the same as in the first embodiment. The second embodiment scans an entire frequency band in which digital audio broadcast signals may appear, referred to below as a DAB band.

In step 101, the controller 19 sets tuning data in the local oscillator 4 corresponding to the lowest frequency in the DAB band. In steps 102 and 103, the level of the received signal and the presence of null symbols are checked as in the first embodiment. If the received signal level is below the threshold, or if null symbols are not found, the controller 19 increases the frequency setting of the local oscillator 4 by a quantity $f_1$, substantially equal to the bandwidth of a digital audio broadcast signal, in step 110, and compares the resulting frequency setting with the highest frequency in the DAB band in step 111. If the resulting frequency setting does not exceed the highest frequency in the DAB band, steps 102 and 103 are repeated; otherwise, the entire procedure is repeated from step 101.

When null symbols are detected in step 103, the frequency error detector 13 and controller 19 carry out the same procedure as in the first embodiment in steps 104 to 123 to notify the user, then to find the center frequency of the digital audio broadcast signal. The search procedure terminates when the local oscillator 4 has been set to the center frequency in step 107. If the center frequency cannot be found within the limit number of attempts, a return is made from step 123 to step 110 to increase the receiving frequency by $f_1$ and try again.

Figure 6:
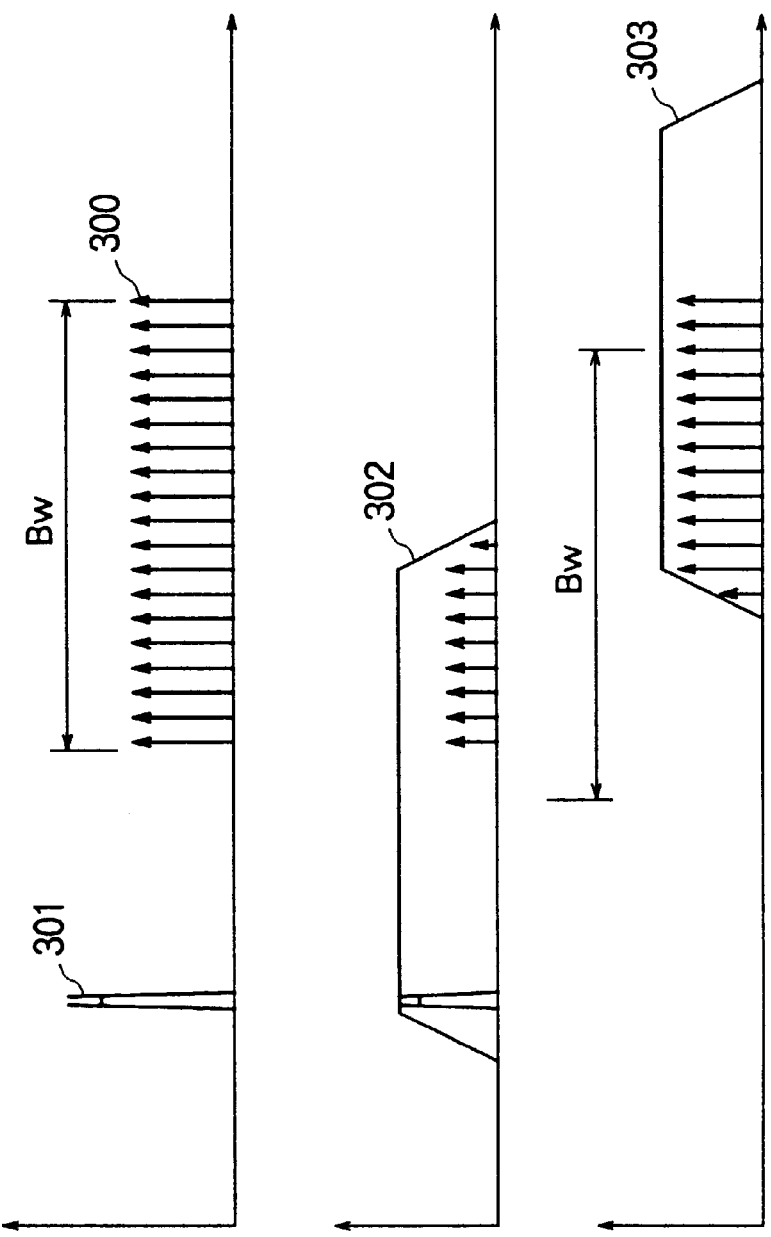
FIG. 6A illustrates frequency spectra of a digital audio broadcast signal and an analog broadcast signal.
FIGS. 6B and 6C illustrate received frequency spectra at two points in the search for a receivable digital audio broadcast signal in the second embodiment.

Comparison of the level of the received signal with a threshold in step 102 suffices for preliminary identification of a digital audio broadcast signal, because the power of a digital audio broadcast signal is distributed substantially uniformly over the bandwidth of the signal. This is illustrated in FIGS. 6A, 6B, and 6C, in which the horizontal axis indicates frequency and the vertical axis indicates power. FIG. 6A shows the spectrum of a digital audio broadcast 300, having a bandwidth $B_W$ substantially equal to $f_1$, and the spectrum of a conventional analog broadcast signal 301 with a much narrower bandwidth.

FIGS. 6B and 6C explain why the power level of the received signal only has to be detected at intervals of $f_1$. In FIG. 6B, the local oscillator 4 has been set to a frequency between the analog broadcast frequency 301 and the center frequency of the digital audio broadcast 300. The receiver receives a spectrum of frequencies 302 including both the analog broadcast signal 301 and the lower part of the digital audio broadcast spectrum 300. The received power exceeds the threshold tested in step 102, but interference from the analog broadcast signal 300 obscures the null symbols, so the controller 19 raises the receiving frequency by $f_1$ in step 110.

As shown in FIG. 6C, the received spectrum 303 now includes the upper part of the digital audio broadcast spectrum 300. The received signal comprises more than half of the spectrum of the digital audio broadcast. The received power exceeds the threshold in step 102, and suffices for the detection of null symbols in step 103.

If there is a possibility that an analog broadcast signal might cause false detection of null symbols in step 103, the second embodiment can be varied by carrying out step 104 after a positive result has been obtained in step 106; that is, by activating the indicator 20 after the center frequency has been found. The user is still notified of the presence of a receivable digital audio broadcast signal without any de-interleaving and decoding delays, before the broadcast is actually heard.

By first searching for a receivable signal on the basis of the received signal level and the presence of null symbols, in large frequency increments of $f_1$, the second embodiment can minimize the time necessary for scanning a band with unknown digital audio broadcast frequencies. Null symbol detection provides a quick way to discriminate between digital audio broadcast broadcasts and analog broadcasts, so during the scan, the user can be promptly notified of the presence or absence of a digital audio broadcast at each frequency that is examined.

The second embodiment can also be used in an area with a known frequency grid, to find digital audio broadcast signals that have been relocated to frequencies not in the grid, to avoid interference from nearby analog signal broadcasters.

Third Embodiment

Figure 7:
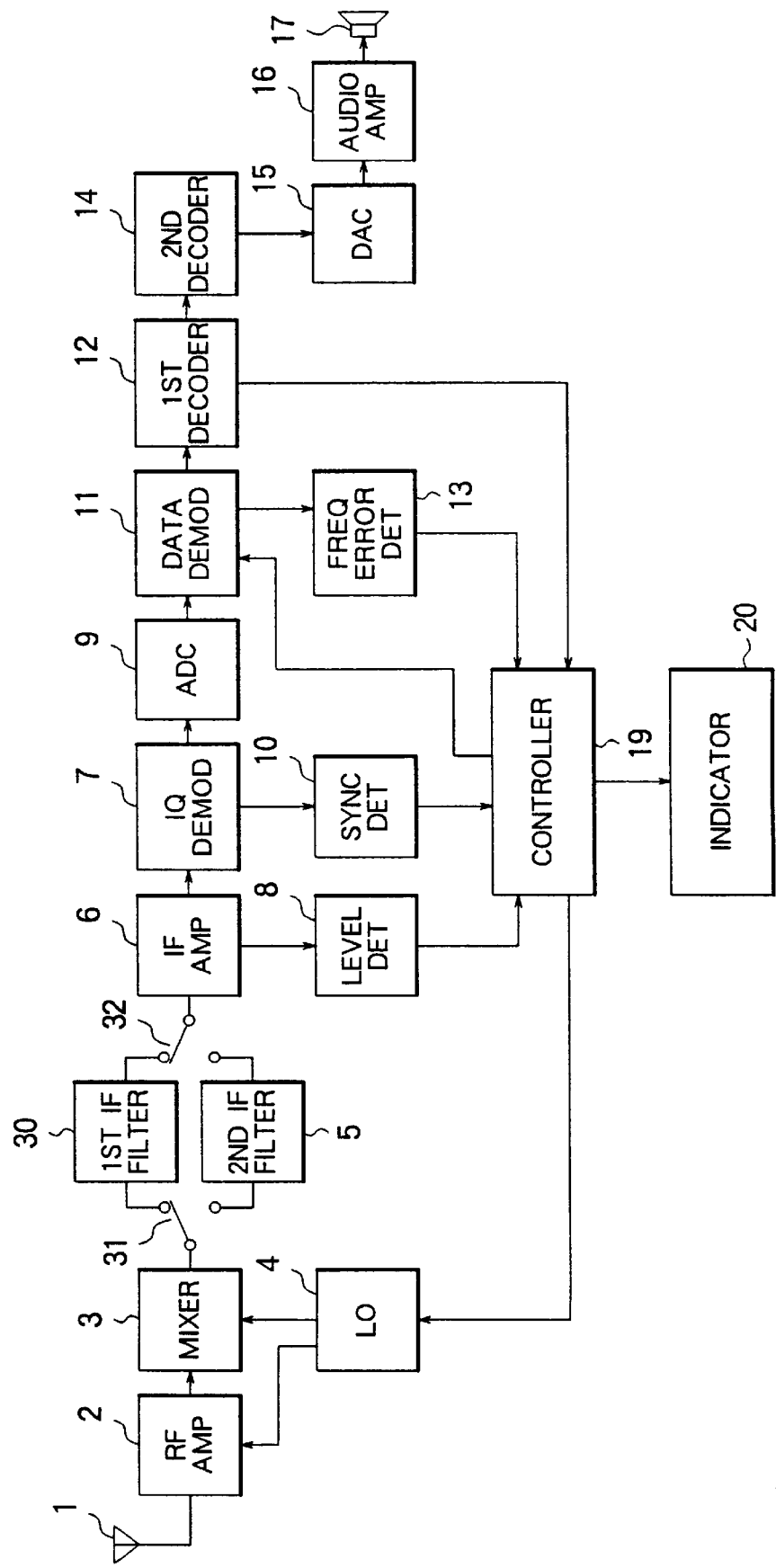
FIG. 7 is a block diagram of a digital audio broadcast receiver illustrating a third embodiment of the invention.

Referring to FIG. 7, the third embodiment has a first IF filter 30, and a second IF filter 5 identical to the IF filter 5 in the preceding embodiments. The first IF filter 30 has a narrower passband than the second IF filter 5. These two IF filters 5 and 30 are coupled in parallel between the mixer 3 and IF amplifier 6 by a pair of switches 31 and 32. The switches 31 and 32 are controlled by the controller 19. The other elements in FIG. 7 are identical or equivalent to the corresponding elements in FIG. 1.

Figure 8:
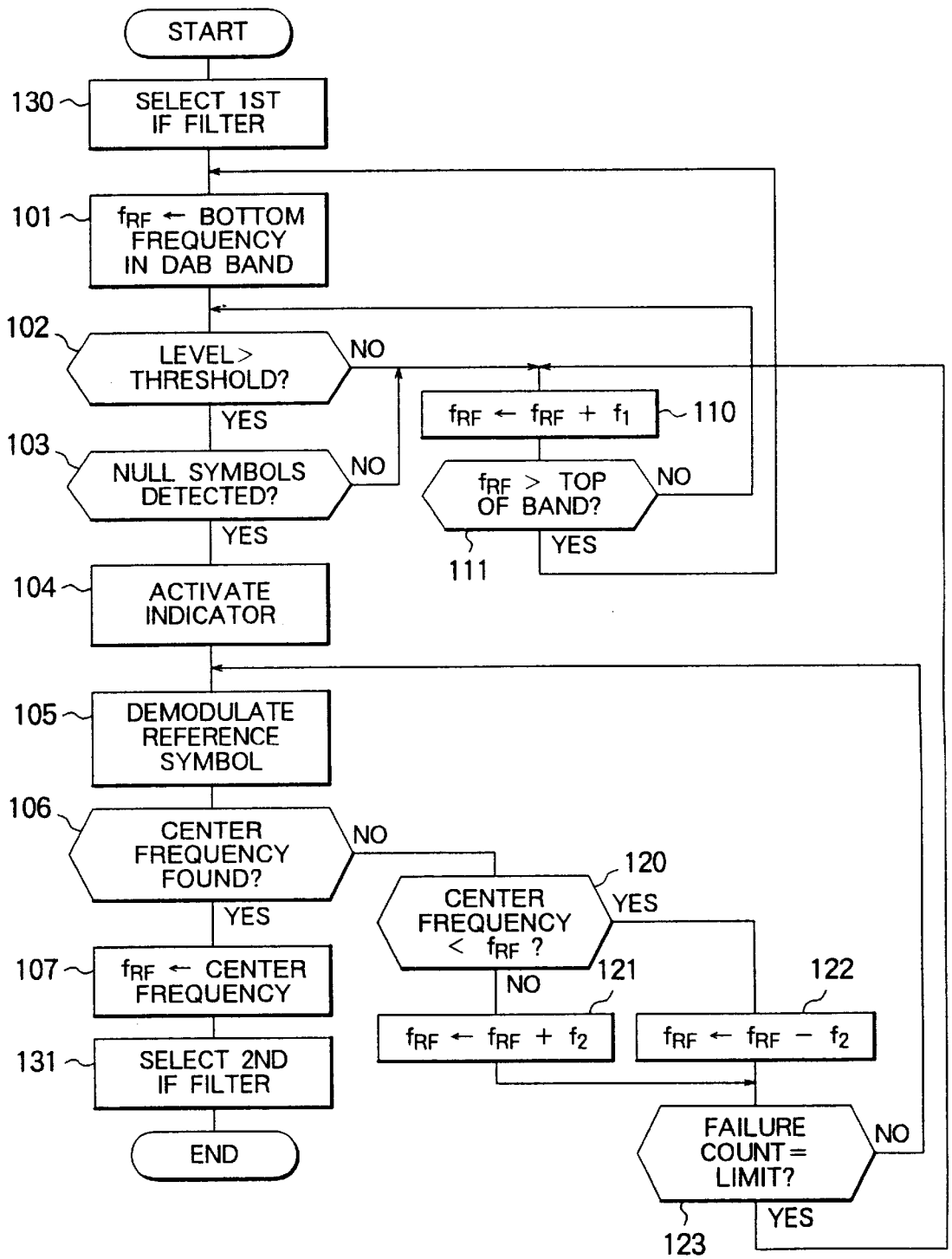
FIG. 8 is a flowchart illustrating the operation of the third embodiment.

FIG. 8 illustrates the procedure followed by the third embodiment in searching for a receivable digital audio broadcast signal in an area without a known frequency grid. This procedure includes all the steps described in the second embodiment, which are shown with the same reference numerals as in FIG. 5, and additional steps 130 and 131.

In the first additional step 130, which is the first step of the search procedure, the controller 19 sets switches 31 and 32 to select the first IF filter 30. The subsequent search procedure is thus carried out with the received signal restricted to a more narrow bandwidth than in the second embodiment.

When the center frequency has been found in step 106 and the local oscillator 4 has been set to the center frequency in step 107, in the second additional step 131, the controller 19 sets switches 31 and 32 to select the second IF filter 5. The digital audio broadcast signal is then received as in the second embodiment.

Figures 9A, 9B, 9C:
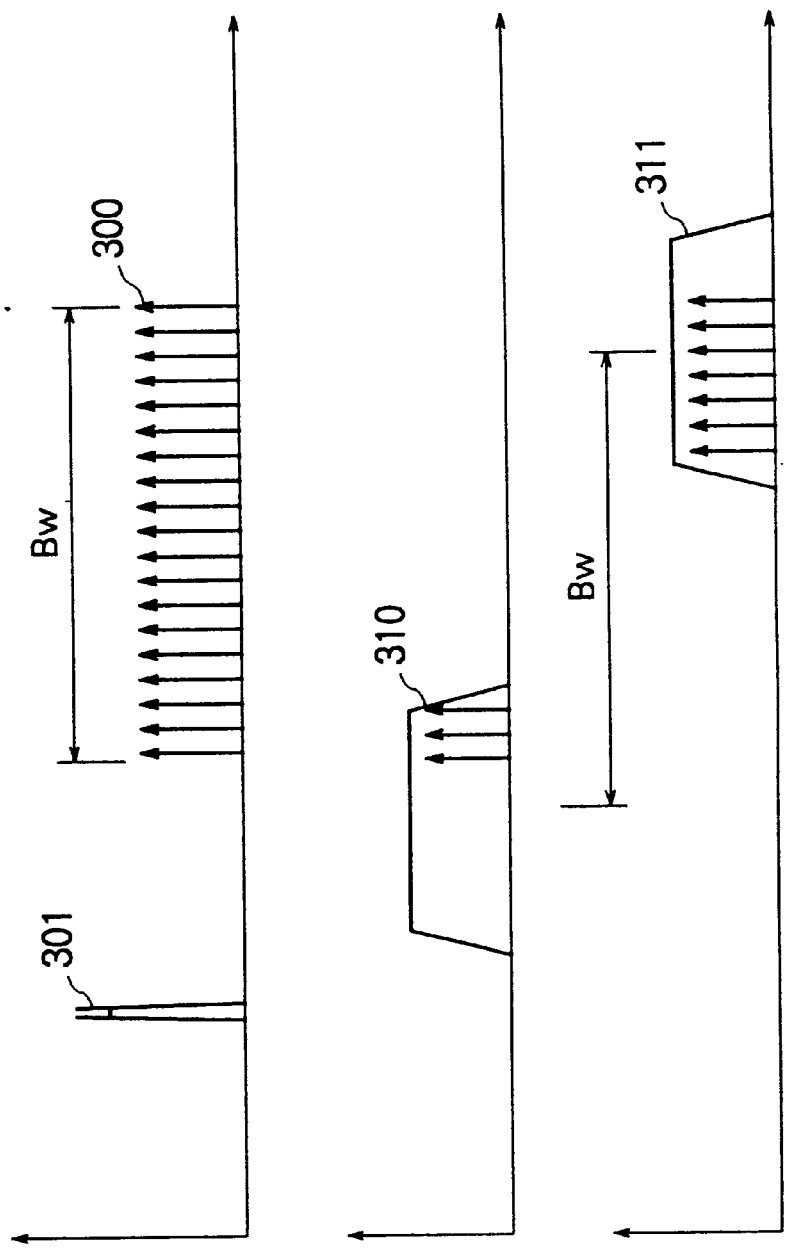
FIG. 9A illustrates the same broadcast spectra as FIG. 6A.
FIGS. 9B and 9C illustrate received frequency spectra at two points in the search for a receivable digital audio broadcast signal in the third embodiment.

FIGS. 9A, 9B, and 9C illustrate the search procedure for the same case as in FIGS. 6A, 6B, and 6C, in which a digital audio broadcast signal 300 and an analog broadcast signal 301 are present. FIG. 9A is identical to FIG. 6A. FIGS. 9B and 9C are identical to FIGS. 6B and 6C except that the received bandwidths 310 and 311 are narrower, owing to use of the first IF filter 30. In FIG. 9B, the receiver receives only the lower part of the digital audio broadcast signal, and can detect null symbols without interference from the analog broadcast signal.

The third embodiment is particularly advantageous in scanning a frequency band in which both digital audio broadcast signals and other signals are present, enabling digital audio broadcast signals to be found even in close proximity to analog broadcast signals.

Fourth Embodiment

Figure 10:
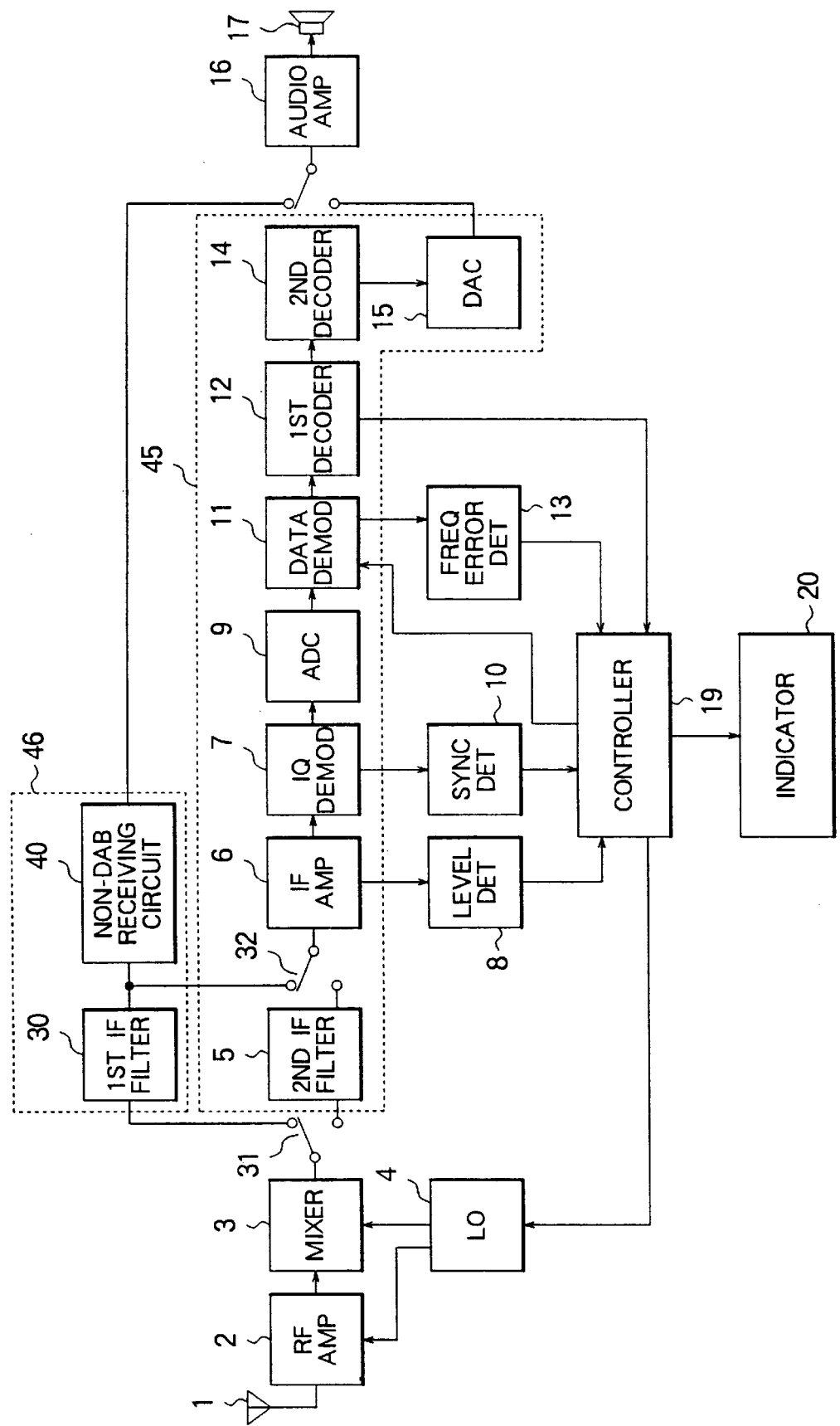
FIG. 10 is a block diagram of a digital audio broadcast receiver illustrating a fourth embodiment of the invention.

Referring to FIG. 10, the fourth embodiment has the same two IF filters 5 and 30 and switches 31 and 32 as the third embodiment, and also has a receiving circuit for receiving broadcast signals other than digital audio broadcast signals. This non-DAB receiving circuit 40 is, for example, a frequency-modulation (FM) receiving circuit. The non-DAB receiving circuit 40 receives the output of the first IF filter 30, and supplies a demodulated analog signal to a switch 41. This switch 41 selects between the outputs of the digital-to-analog converter 15 and the non-DAB receiving circuit 40, coupling the selected output to the audio amplifier 16. Switch 41 is controlled by the controller 19.

The elements from the second IF filter 5 to the digital-to-analog converter 15 form a DAB receiving system 45, while the first IF filter 30 and non-DAB receiving circuit 40 form a non-DAB receiving system 46. Both receiving systems 45 and 46 share the same RF front end, comprising the RF amplifier 2, mixer 3, and local oscillator 4.

In searching for a receivable digital audio broadcast signal, the fourth embodiment can follow the same procedure as the third embodiment, shown in FIG. 8. This procedure can also be modified, however, by having the receiver dwell on frequencies at which a broadcast signal without null symbols is detected, with switch 41 set to select the non-DAB receiving circuit 40. Both digital audio broadcast signals and other broadcast signals can thereby be scanned in a single search.

FM receivers generally employ a filter having a passband width of about two hundred to three hundred kilohertz (200–300 kHz). The subcarrier spacing in Eureka DAB transmission mode I is only one kilohertz (1 kHz). An IF filter 30 suitable for FM reception thus provides ample width for locating the center frequency of a digital audio broadcast employing transmission mode I. It is also anticipated that when broadcast frequencies are assigned, a spacing of at least two hundred kilohertz will be maintained between adjacent broadcast signals, so with a first IF filter 30 suitable for FM reception, the probability that a non-DAB signal will interfere with a DAB signal during the search for a receivable digital audio broadcast signal is quite low.

The non-DAB receiving circuit 40 in the fourth embodiment is not limited to an FM receiving circuit, but may be, for example, a circuit for receiving narrow-band digital broadcasts. In this case, the DAB receiving system and non-DAB receiving system can also share the same OFDM demodulating circuitry, from the IF amplifier 6 to the data demodulator 11.

By sharing the same RF front end and possibly other circuits, the fourth embodiment enables a dual-mode receiver to be provided at a relatively low cost.

Fifth Embodiment

The fifth embodiment has the same hardware configuration as the first and second embodiments, shown in FIG. 1, but follows a different procedure in searching for a receivable digital audio broadcast signal.

Figure 11:
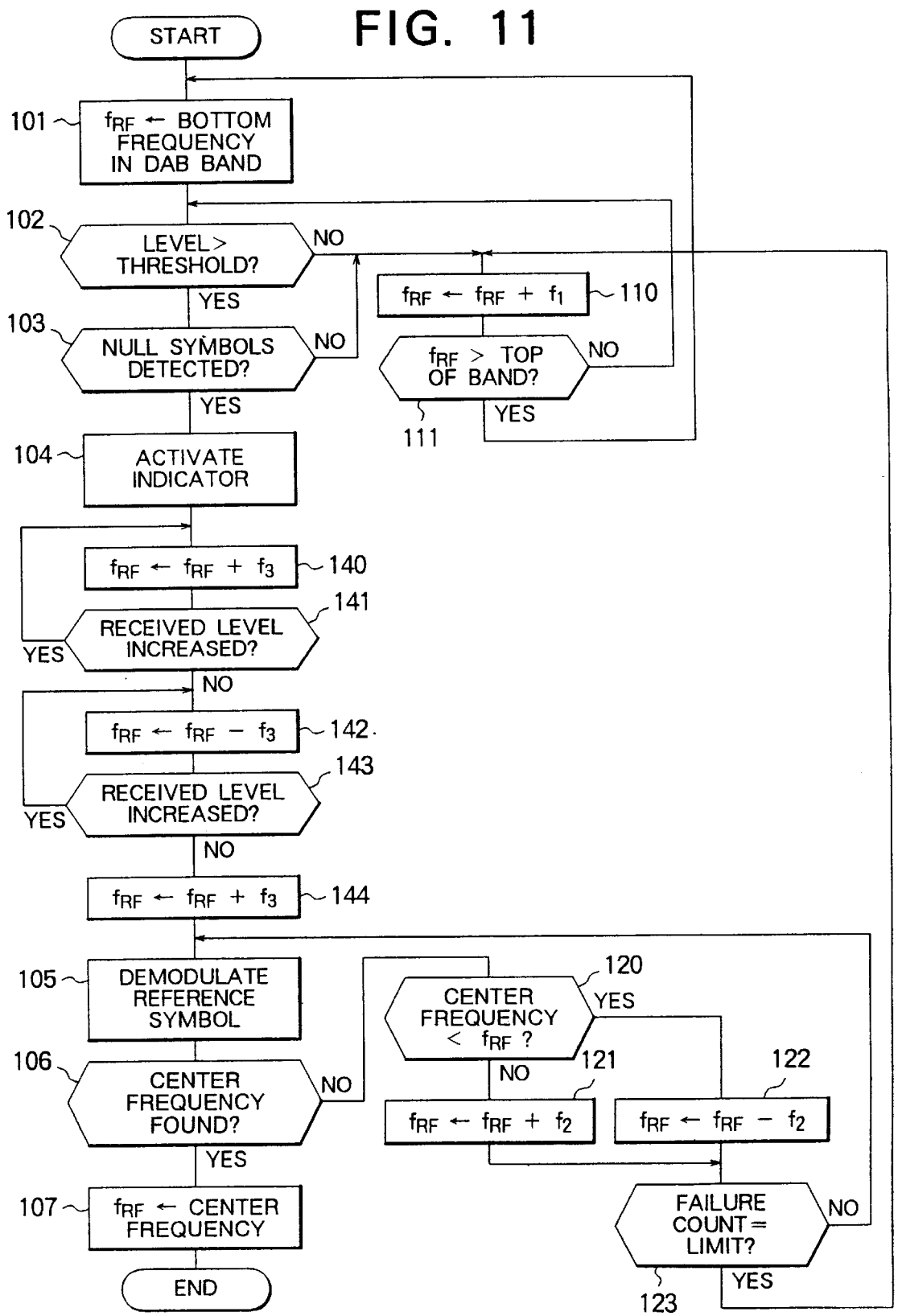
FIG. 11 is a flowchart illustrating the operation of a fifth embodiment.

FIG. 11 shows this procedure, using the same reference numerals as in FIG. 5 for identical or equivalent steps. Steps 101, 102, 103, 104, 110, and 111, ending with the detection of null symbols and notification of the user, are as described in the second embodiment. Steps 101 and 110 may also be replaced by steps 90 and 91 in the first embodiment, in areas with a known digital audio broadcasting frequency grid.

Next, in step 140, the controller 19 increases the frequency setting of the local oscillator 4 by an amount $f_3$ less than half of the frequency $f_1$. This amount $f_3$ may be, for example, an order of magnitude less than $f_1$. In step 141, the controller 19 determines whether this increase results in an increase in the received level reported by the level detector 8. If so, steps 140 and 141 are repeated, these repetitions continuing as long as the received level continues to increase. When the repetitions of steps 140 and 141 cease, the receiving frequency is located at a point higher than the frequency at which a peak received level is obtained.

Next, in step 142, the controller 19 decreases the frequency setting of the local oscillator 4 by $f_3$. In step 143, the controller 19 determines whether this decrease results in an increase in the received level reported by the level detector 8. If so, steps 142 and 143 are repeated, until an increase in received level is no longer obtained. At this point, the receiving frequency has been moved to a point about $f_3$ below the frequency at which the peak received level is obtained. In step 144, the controller 19 increases the frequency setting of the local oscillator 4 by $f_3$ again, thereby setting the receiving frequency to the frequency at which the peak received level is obtained.

Steps 105 to 123 are then carried out as in the first and second embodiments to find the center frequency of the digital audio broadcast signal and set the local oscillator 4 to that frequency. Since the local oscillator 4 has already been set to a frequency that produces a peak received signal level, and since the bandwidth passed by the IF filter 5 is substantially equal to the bandwidth of the digital audio broadcast signal, the receiving frequency will already be close to the center frequency. The center frequency will accordingly almost always be found in the demodulated data the first time steps 105 and 106 are carried out, and it will rarely be necessary to loop through steps 120 to 123.

Since the level of the received signal can be detected from data symbols as well as the reference symbol, locating the center frequency by detecting the received level as in steps 140 to 144 is faster than locating the center frequency by repetitions of steps 105, 106, and 120 to 123. When a search is carried out with a wideband IF filter 5, the fifth embodiment can significantly shorten the search time.

Although the invention has been described in relation to the Eureka DAB standard, it is anticipated that other digital audio broadcasting systems may be developed in which the invention can be usefully practiced.

In such other systems, the details of the method of using demodulated data to locate the center frequency of the broadcast may naturally differ from the description given above. Different coding and modulation systems may also be used.

The hardware structure of the embodiments shown in the drawings permits various modifications. For example, the structure of the local oscillator can be modified.

The procedures shown in the flowcharts can also be modified. For example, the search procedure in steps 140 to 144 in FIG. 11 can be changed to a binary search procedure using frequency steps of diminishing sizes less than half $f_1$, instead of a fixed size $f_3$.

Those skilled in the art will recognize that further variations are possible within the scope claimed below.

What is claimed is:

1. A method of automatically searching for a receivable digital audio broadcast signal having a bandwidth substantially equal to a certain quantity $f_1$, the receivable digital audio broadcast signal being divided into frames, each frame having a frame synchronization symbol, comprising the steps of:
   (a) setting a digital audio broadcast receiver to a certain receiving frequency;
   (b) detecting a resulting level of a received signal;
   (c) changing said receiving frequency by an amount at least equal to said quantity $f_1$, and returning to said step (b), if the level of said received signal is below a predetermined threshold;
   (d) attempting to detect said frame synchronization symbol in said received signal, if the level of said received signal is above said threshold;
   (e) changing said receiving frequency by an amount at least equal to said quantity $f_1$, and returning to said step (b), if said frame synchronization symbol cannot be detected;
   (f) attempting to find a center frequency of said digital audio broadcast signal by demodulating said received signal, after said frame synchronization symbol has been detected;
   (g) changing said receiving frequency by an amount at least equal to said quantity $f_1$, and returning to said step (b), if said center frequency cannot be found; and
   (h) setting said receiving frequency to said center frequency, when said center frequency has been found.

2. The method of claim 1, wherein said step (c), said step (e), and said step (g) change said receiving frequency to another frequency in a predetermined grid of digital audio broadcast frequencies.

3. The method of claim 1, wherein said step (c), said step (e), and said step (g) change said receiving frequency by an amount equal to said quantity $f_1$.

4. The method of claim 1, wherein said step (f) further comprises the steps of:
   (f1) attempting to find said center frequency within said received signal; and
   (f2) changing said receiving frequency by an amount less than said quantity $f_1$, and repeating said step (f1), if said center frequency cannot be found within said received signal.

5. The method of claim 1, further comprising the steps of:
   (i) changing said receiving frequency in increments of less than half said quantity $f_1$, to find a frequency that produces a peak level of said received signal; and
   (j) setting said receiving frequency to said frequency that produces said peak level;

said steps (i) and (j) being performed after said frame synchronization symbol has been detected but before said step (f).

6. The method of claim 1, further comprising the steps of:
   (k) selecting a first filter with a first passband narrower than said quantity $f_1$ while searching for said receivable digital audio broadcast signal; and
   (l) selecting a second filter with a second passband wider than said first passband for receiving said digital audio broadcast signal after said step (h).

7. The method of claim 1, further comprising the step of:
   (m) providing an indication to a user of said digital audio broadcast receiver, when said frame synchronization symbol is detected.

8. The method of claim 1, further comprising the step of:
   (n) providing an indication to a user of said digital audio broadcast receiver, when said center frequency is found.

9. A digital audio broadcast receiver for receiving a digital audio broadcast signal having a bandwidth substantially equal to a certain quantity $f_1$, the receivable digital audio broadcast signal being divided into frames, each frame having a frame synchronization symbol, the digital audio broadcast receiver having a local oscillator for determining a receiving frequency, and a data demodulator for demodulating the digital audio broadcast signal to obtain data, the digital audio broadcast receiver also comprising:
   a level detector for detecting a level of a received signal;
   a frame synchronization detector for detecting said frame synchronization symbol in said received signal;
   a frequency error detector for locating a center frequency of said received signal from data demodulated from said received signal by said data demodulator; and
   a controller coupled to said level detector, said frame synchronization detector, and said frequency error detector, for controlling said local oscillator by setting a certain receiving frequency, changing the receiving frequency by amounts at least equal to said quantity $f_1$ until the level of the received signal is at least equal to a predetermined threshold and said frame synchronization symbol is detected, next changing said receiving frequency, if necessary, by an amount less than said quantity $f_1$ until said center frequency is found within the data demodulated from said received signal, then setting said receiving frequency to said center frequency and commencing reception of a digital audio broadcast centered at said center frequency.

10. The digital audio broadcast receiver of claim 9, wherein said controller, in changing the receiving frequency by amounts at least equal to said quantity $f_1$, searches through a predetermined grid of digital audio broadcast frequencies.

11. The digital audio broadcast receiver of claim 9, wherein said controller, in changing the receiving frequency by amounts at least equal to said quantity $f_1$, changes said receiving frequency in steps equal to said quantity $f_1$.

12. The digital audio broadcast receiver of claim 9, wherein, after finding a receiving frequency at which the level of said received signal is at least equal to said predetermined threshold and said frame synchronization symbol is detected, but before attempting to find said center frequency, said controller changes said receiving frequency in steps of less than half said quantity $f_1$ until said level detector detects a peak level of said received signal.

13. The digital audio broadcast receiver of claim 9, further comprising:
   a first filter with a first passband narrower than said quantity $f_1$, for filtering said received signal while said controller is searching for said receivable digital audio broadcast signal; and
   a second intermediate-frequency filter with a second passband wider than said first passband, for filtering said received signal during the reception of said digital audio broadcast signal.

14. The digital audio broadcast receiver of claim 13, further comprising a receiving circuit coupled to said first filter, for receiving a broadcast signal other than said digital audio broadcast signal, using said first filter.

15. The digital audio broadcast receiver of claim 9, further comprising an indicator, coupled to said controller, for indicating that said receivable digital audio broadcast signal has been found.

16. The digital audio broadcast receiver of claim 15, wherein said controller activates said indicator when said frame synchronization symbol is detected.

17. The digital audio broadcast receiver of claim 15, wherein said controller activates said indicator when said center frequency is found.

* * * * *